(12) United States Patent
Kojima

(10) Patent No.: US 9,942,996 B2
(45) Date of Patent: Apr. 10, 2018

(54) ELECTRONIC CIRCUIT UNIT

(71) Applicant: JTEKT CORPORATION, Osaka-shi (JP)

(72) Inventor: Yoshihiro Kojima, Okazaki (JP)

(73) Assignee: JTEKT CORPORATION, Osaka-shi (JP)

( * ) Notice: Subject to any disclaimer, the term of this patent is extended or adjusted under 35 U.S.C. 154(b) by 0 days.

(21) Appl. No.: 15/352,065

(22) Filed: Nov. 15, 2016

(65) Prior Publication Data
US 2017/0150619 A1 May 25, 2017

(30) Foreign Application Priority Data

Nov. 19, 2015 (JP) .................................. 2015-226831

(51) Int. Cl.
*H05K 5/03* (2006.01)
*H05K 5/02* (2006.01)
*H05K 5/00* (2006.01)

(52) U.S. Cl.
CPC ........... *H05K 5/0069* (2013.01); *H05K 5/006* (2013.01); *H05K 5/0052* (2013.01); *H05K 5/03* (2013.01)

(58) Field of Classification Search
CPC ............................. H05K 5/006; H05K 5/0069
See application file for complete search history.

(56) References Cited

U.S. PATENT DOCUMENTS

| 5,703,754 | A * | 12/1997 | Hinze ................. B60R 16/0239 174/562 |
| 6,407,925 | B1* | 6/2002 | Kobayashi ........... H05K 5/0052 200/61.88 |
| 6,927,337 | B2* | 8/2005 | Kobayashi .......... B60R 16/0239 174/535 |
| 7,563,992 | B2* | 7/2009 | Lawlyes .............. H05K 9/0073 174/561 |
| 8,101,873 | B2* | 1/2012 | Bungo ................... H05K 3/284 174/521 |
| 8,520,397 | B2* | 8/2013 | Azumi ................. H05K 5/0052 361/730 |
| 2006/0286845 | A1* | 12/2006 | Hinze .................... H05K 1/144 439/276 |
| 2009/0180265 | A1* | 7/2009 | Chlumsky ............. H05K 5/006 361/759 |

(Continued)

FOREIGN PATENT DOCUMENTS

JP 2014-187100 10/2014

*Primary Examiner* — Hung V Ngo
(74) *Attorney, Agent, or Firm* — Oblon, McClelland, Maier & Neustadt, L.L.P.

(57) ABSTRACT

An electronic circuit unit is provided that allows the increase in the size thereof to be suppressed. An electronic circuit unit 1 includes a board, a housing, and a cover. A board mount portion is disposed in the closest position to an outer edge of the housing, except for peripheral walls of the housing. An outer edge of the board is placed on the board mount portion of the housing, and a peripheral portion of the cover is placed on the outer edge of the board. Screws are inserted into screw holes of the housing; spaces defined by recess portions of the board 10 and the peripheral walls; and screw holes of the cover. Then, the outer edge of the board is sandwiched between the board mount portion of the housing and the peripheral portion of the cover.

8 Claims, 4 Drawing Sheets

(56) References Cited

U.S. PATENT DOCUMENTS

| | | | |
|---|---|---|---|
| 2009/0316372 A1* | 12/2009 | Kozlovski | H05K 5/006 361/757 |
| 2011/0170269 A1* | 7/2011 | Blossfeld | H01R 13/6658 361/752 |
| 2012/0057318 A1* | 3/2012 | Oota | H05K 5/006 361/753 |
| 2012/0069532 A1* | 3/2012 | Azumi | H05K 5/0052 361/752 |
| 2013/0072040 A1* | 3/2013 | Ohhashi | H05K 5/0069 439/76.1 |
| 2013/0186204 A1* | 7/2013 | Luhr | H05K 5/0056 73/649 |
| 2014/0080329 A1* | 3/2014 | Yamanaka | H05K 5/0069 439/76.1 |
| 2015/0216088 A1* | 7/2015 | Kawai | H05K 1/0203 361/710 |
| 2016/0066458 A1* | 3/2016 | Hirose | H05K 5/006 361/752 |
| 2016/0094261 A1* | 3/2016 | Yildirim | H04B 1/3888 455/90.1 |

* cited by examiner

ELECTRONIC CIRCUIT UNIT

INCORPORATION BY REFERENCE

The disclosure of Japanese Patent Application No. 2015-226831 filed on Nov. 19, 2015 including the specification, drawings and abstract, is incorporated herein by reference in its entirety.

BACKGROUND OF THE INVENTION

1. Field of the Invention

The present invention relates to an electronic circuit unit.

2. Description of Related Art

An electronic circuit unit mounted on a vehicle is achieved such that a board on which electronic components are mounted is housed in a resin case constituted by a housing and a cover (Japanese Patent Application Publication No. 2014-187100 (JP 2014-187100 A)). The housing and the cover are secured to each other with any type of fastening members, such as screws and snap fittings. The board is sandwiched between the housing and the cover, and thus is secured to the housing.

The board is sandwiched between the housing and the cover, conventionally on a portion of the board that is a little apart from the outer edge of the board. In this case, the outer edge of the board is not used for any purpose and useless. Thus, in the case where the useless portion as well as the necessary portion of the board is housed in the case with the conventional structure, the size of the electronic circuit unit is increased.

SUMMARY OF THE INVENTION

An object of the present invention is to provide an electronic circuit unit capable of suppressing an increase in size.

An electronic circuit unit of one aspect of the present invention includes:

a board;

a housing including a bottom wall, a side wall provided corresponding to an outer edge shape of the board, and a support portion on which the outer edge of the board is placed; and a cover to cover the board, provided corresponding to an outer edge shape of the housing and placed on the housing.

The board is sandwiched, at the outer edge of the board, between the support portion of the housing and the outer edge of the cover.

With this configuration, the board is sandwiched, at the outer edge of the board, between the housing and the cover, and thus is secured to the housing. In this case, the outer edge of the board is effectively used, and thus the portion, a little apart from the outer edge of the board and conventionally used to sandwich the board, is not needed for that purpose. This allows the increase in the size of the electronic circuit unit to be suppressed.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
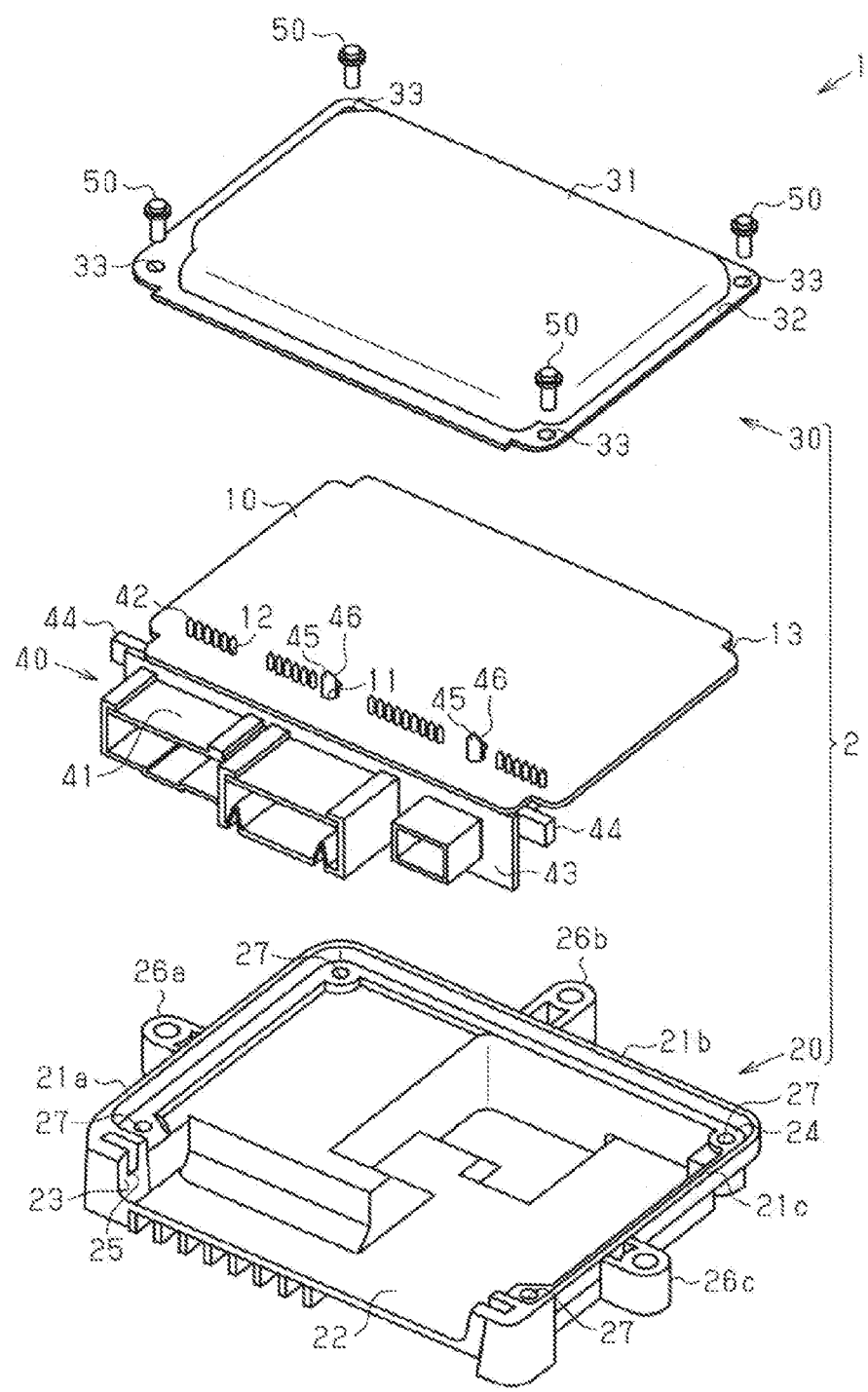
FIG. 1 is a perspective view showing structures of components of an electronic circuit unit of one embodiment.

Hereinafter, one embodiment of an electronic circuit unit of the present invention will be described. As shown in FIG. 1, an electronic circuit unit 1 includes a board 10, and a case 2 to house the board 10. The case 2 is constituted by a housing 20 and a cover 30.

The board 10 is a printed board on which wiring patterns (not shown) are formed for mounting a variety of electronic components, such as chip components and integrated circuits. The wiring patterns of the board 10 are electrically connected to a connector 40. The connector 40 is secured to one surface of the board 10 by soldering and snap fitting. The board 10 is rectangular, and is provided with a plurality of snap fitting receiving portions 11 arranged in a longitudinal direction of the board 10, at positions a given distance away from an edge of a long side of the board 10. The board 10 is also provided with a plurality of through-holes 12 arranged in the longitudinal direction of the board 10, at positions a given distance away from the edge of the long side of the board 10. The positions of the through-holes 12 correspond to the positions of the terminals of the connector 40. The board 10 is also provided with recess portions 13 at the four corners of the board 10. The recess portions 13 are formed by cutting the four corners of the board 10 into a rectangular shape.

The housing 20 is formed in a cuboid whose two faces are open. The housing 20 houses the board 10, the connector 40, and various electronic components. The housing 20 has a rectangular bottom wall 22, and peripheral walls 21a, 21b, 21c formed along three sides of the bottom wall 22. The housing 20 houses the board 10 in a space (recess portion) surrounded by the bottom wall 22 and the peripheral walls 21a, 21b, 21c. The remaining one face of the side walls of the housing 20, in which a peripheral wall is not formed, is used as an opening 23 for attaching the connector 40. A board mount portion 24 is formed on the inner surface of the housing 20, along the peripheral walls 21a, 21b, 21c. In other words, the board mount portion 24 is a step portion formed inside the peripheral walls 21a, 21b, 21c that are the side walls of the housing 20. The board mount portion 24 is a portion (support portion) of the housing 20 on which the board 10 is placed. The height of the board mount portion 24 with respect to the bottom wall 22 is lower than that of the peripheral walls 21a, 21b, 21c. The board mount portion 24 is provided with four screw holes 27 at the four corners thereof.

When the board 10 is placed on the board mount portion 24, the board 10 is in no contact with the bottom wall 22. At both ends of the opening 23 in a longitudinal direction thereof, slit-like groove portions 25 are formed in the longitudinal direction. The size of the housing 20 is determined so that the board 10 can be placed inside the peripheral walls 21a, 21b, 21c. In addition, semicircular stays 26a, 26b, 26c are formed on outer surfaces of the peripheral walls 21a, 21b, 21c, projecting toward the outside of the housing 20.

The cover 30 has a cuboidal box portion 31 whose one face is open, and a flange-like peripheral portion 32 (outer edge) formed around the opening end of the box portion 31. That is, the longitudinal length of the peripheral portion 32 is larger than the longitudinal length of the box portion 31; the lateral length of the peripheral portion 32 is larger than the lateral length of the box portion 31. The peripheral portion 32 is provided with four screw holes 33 at the four corners thereof.

Figure 2:
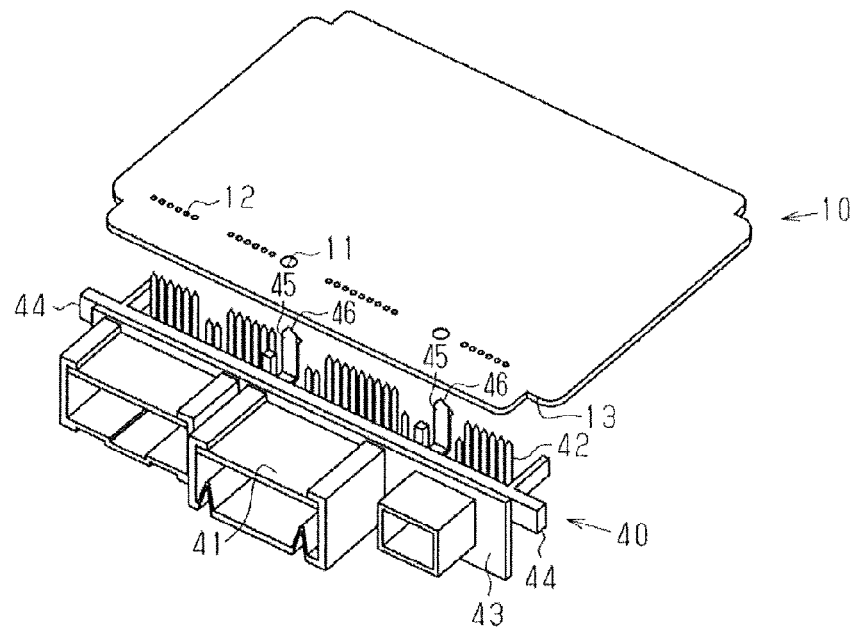
FIG. 2 is a perspective view showing structures of a connector and a board of the electronic circuit unit of the embodiment.

As shown in FIG. 2, the connector 40 has a plurality of connecting portions 41 used to connect the electronic circuit unit 1 to various devices; a plurality of terminal portions 42 each provided for each of the connecting portions 41; and a plate portion 43 to which the connecting portions 41 and the terminal portions 42 are secured. One example of the connecting portions 41 is female connectors. The connecting portions 41 are each formed in a cuboid whose one face is open. The connecting portions 41 are aligned with each other in a longitudinal direction of the plate portion 43.

The terminal portions 42 pass through the bottom walls of the connecting portions 41 and the plate portion 43, with outer ends of the terminal portions 42 extending in a direction (upper direction) perpendicular to the connecting portions 41. The plate portion 43 has a rectangular shape. The plate portion 43 is provided with projection portions 44, at both ends thereof, in the longitudinal direction of the plate portion 43. The projection portions 44 are formed to fit into the groove portions 25 of the housing 20. The two projection portions 44 are projecting opposite to each other in the longitudinal direction of the plate portion 43, from two sides of the plate portion 43 both extending in the lateral direction of the plate portion 43.

The plate portion 43 is also provided with a plurality of snap fitting hooks 45. The snap fitting hooks 45 are each arranged between adjacent terminal portions 42. At the end of each of the snap fitting hooks 45, an engaging projection portion 46 is formed. The engaging projection portion 46 has a sloped surface that is sloped away from the plate portion 43 from the tip to the base of the engaging projection portion 46. That is, the end of the snap fitting hook 45 is formed like an arrowhead. The positions of the plurality of snap fitting hooks 45 and the positions of the plurality of snap fitting receiving portions 11 match with each other, in a direction (normal direction to the board 10) perpendicular to the connecting portions 41. At this time, the positions of the terminal portions 42 (i.e. positions of terminals of the terminal portions 42) and the positions of the through-holes 12 match with each other.

As shown in FIG. 1, the connector 40 is integrated with the board 10. For this, the terminal portions 42 and the snap fitting hooks 45 are matched in position with the through-holes 12 and snap fitting receiving portions 11 respectively, in the normal direction to the board 10; then the board 10 and the connector 40 are moved closer to each other for the integration. The terminal portions 42 (i.e. terminals of the terminal portions 42) pass through the corresponding through-holes 12. For example, the engaging projection portion 46 of the snap fitting hook 45 is forced to pass through the snap fitting receiving portion 11 while slightly elastically deforming, and after the passage, elastically recovers its original form. When the snap fitting hook 45 is pulled away from the snap fitting receiving portion 11, the engaging projection portion 46 of the snap fitting hook 45 is engaged with the board 10 to prevent the connector 40 from being detached from the board 10.

Figure 3:
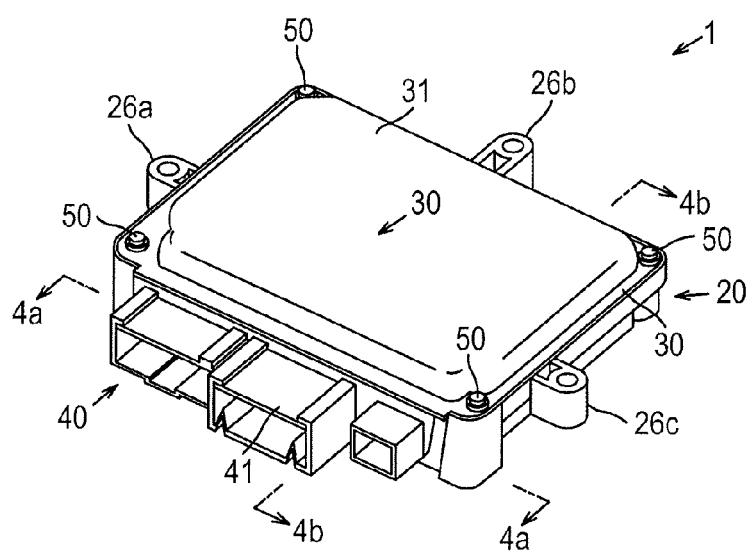
FIG. 3 is a perspective view showing a schematic structure of the electronic circuit unit of the embodiment.

As shown in FIG. 3, the cover 30 is secured to the housing 20 by attaching the cover 30 to the housing 20 that houses the board 10, and then by tightening the screws 50 into the screw holes 27 of the housing 20.

Figure 4A:
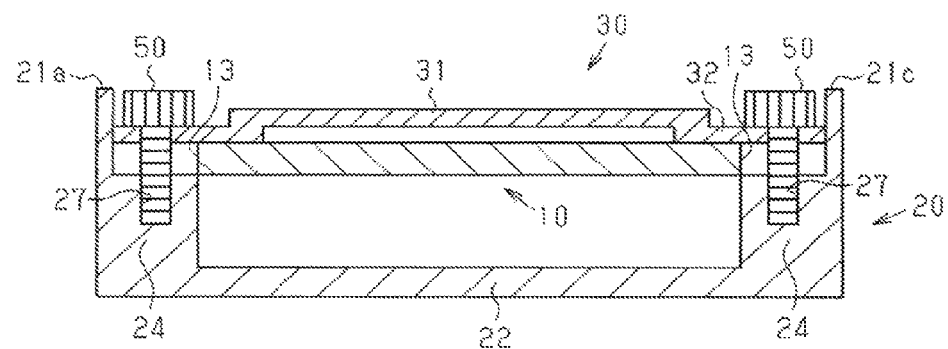
FIG. 4A is a cross-sectional view taken along line 4a-4a of FIG. 3.
Figure 4B:
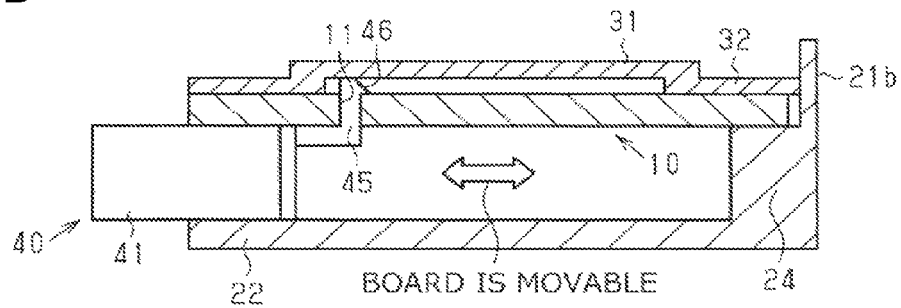
FIG. 4B is a cross-sectional view taken along line 4b-4b of FIG. 3.

As shown in FIGS. 4A and 4B, the board 10 is placed on the board mount portion 24 of the housing 20, and the peripheral portion 32 of the cover 30 is placed on the board 10. With this, the outer edge (edge portion) of the board 10 is sandwiched between the board mount portion 24 of the housing 20 and the peripheral portion 32 of the cover 30.

As shown in FIG. 4A, the screws 50 are inserted into: the screw holes 27 of the housing 20; spaces defined by the recess portions 13 of the board 10 and by peripheral walls 21a, 21b, 21c; and the screw holes 33 of the cover 30. Since the recess portions 13 are formed at the four corners of the board 10, there are clearances at the four corners of the board 10, between the board mount portion 24 of the housing 20 and the peripheral portion 32 of the cover 30.

As shown in FIG. 4B, a portion of the outer edge of the board 10 other than the recess portions 13 is sandwiched between the board mount portion 24 of the housing 20 and the peripheral portion 32 of the cover 30, and thus is secured to the housing 20. An edge of the board 10 to which the connector 40 is attached is supported on the housing 20 via the connector 40.

Advantageous effects of the present embodiment will be described.

1) The board 10 is sandwiched, on its outer edge (edge portion), between the board mount portion 24 of the housing 20 and the peripheral portion 32 of the cover 30, and thus is secured to the housing 20. The outer edge of the board 10 is a portion on which electronic components can hardly be mounted. In the present embodiment, since the outer edge of the board 10 is effectively used as a portion used to secure the board 10 to the housing 20, the size of the electronic circuit unit is suppressed.

2) The board 10 and the connector 40 are secured to each other by fitting the snap fitting hooks 45 into the snap fitting receiving portions 11. This eliminates the need of forming screw threads in the board 10 and the connector 40, making screws unnecessary. Thus, man-hours needed to produce the electronic circuit unit can be reduced.

3) The board 10 is sandwiched between the board mount portion 24 of the housing 20 and the peripheral portion 32 of the cover 30, and thus is secured to the housing 20. With this, when the board 10 is subjected to a force greater than a force to sandwich the board 10, the board 10 can move as indicated by an arrow of FIG. 4B. The amount of the movement of the board 10 is as small as the clearance between a side face of the board 10 and the peripheral walls 21a, 21b, 21c.

For example, when an electronic component (such as a male connector) is attached to or detached from the connector 40, a force is applied to the connector 40 in a direction of attachment and detachment, resulting in another force acting on the board 10 in a direction indicated by the arrow. When the latter force becomes greater than the force of the housing 20 and the cover 30 to sandwich the board 10, the board 10 moves in the direction indicated by the arrow. The movement of the board 10 can reduce stress that is applied from the connector 40 to the board 10. This can prevent the stress from concentrating on a portion, such as a soldered portion, that is electrically connecting a corresponding terminal portion 42 to the board 10.

In contrast to this, when the board 10 is secured to the housing 20 with screws or the like, the stress is applied from the connector 40 directly to the board 10. This can cause the stress to concentrate on a portion, such as a soldered portion.

4) Since the board 10 is in contact with the board mount portion 24 and the peripheral portion 32, the heat produced in the board 10 can be released into the housing 20 and the cover 30. In the case where the board 10 is in contact with the above portions with a sufficient contact area, heat dissipation effect on the board 10 can be increased. The increase in the heat dissipation effect is important because the board 10 is a portion in which a considerable amount of heat is produced from, for example, electronic components.

5) Since the projection portions 44 of the connector 40 are inserted into the groove portions 25 of the housing 20, the connector 40 can be prevented from moving relative to the housing 20. This can further reduce the stress that is applied from the connector 40 to the board 10.

Figure 5:
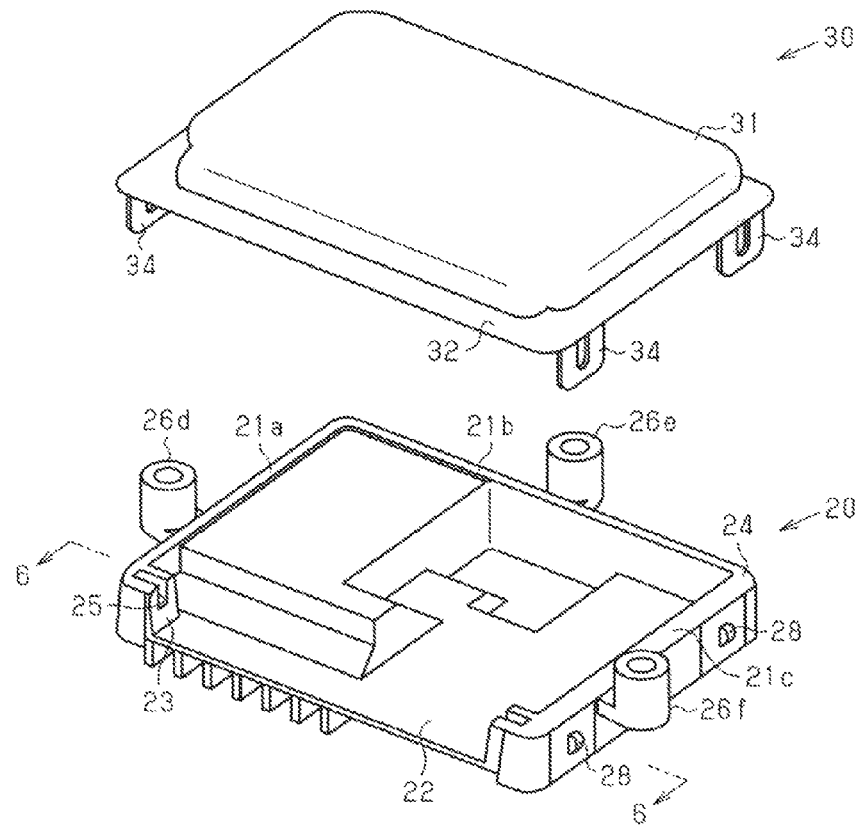
FIG. 5 is a perspective view showing a cover and a housing of an electronic circuit unit of another embodiment.

The present embodiment may be modified as follows. The present embodiment describes the configuration in which the board 10 is sandwiched between the housing 20 and the cover 30 by inserting the screws 50 into the screw holes 27 and the screw holes 33, but is not limited to this. For example, as shown in FIG. 5, the snap fitting hooks 28 may be formed on outer portions of the housing 20, and the snap fitting receiving portions 34 may be formed on the cover 30. In FIG. 5, two snap fitting hooks 28 are formed on each of the outer walls of the housing 20 extending in a direction perpendicular to the longitudinal direction of the housing 20. The snap fitting receiving portions 34 are formed on the peripheral portion 32 of the cover 30, and extending downward from the peripheral portion 32. Two snap fitting receiving portions 34 are formed, corresponding to the snap fitting hooks 28, on each of the outer walls of the cover 30 extending in a direction perpendicular to the longitudinal direction of the cover 30.

Figure 6:
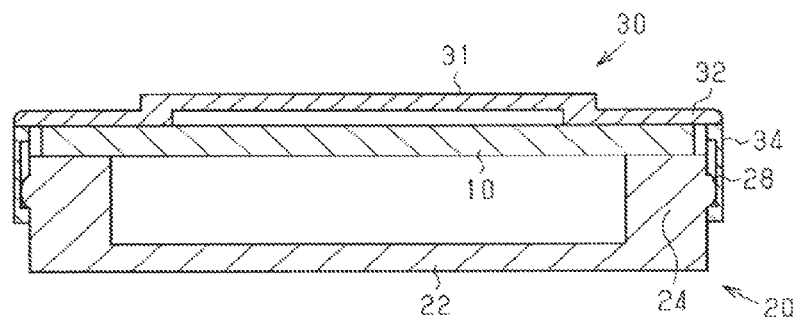
FIG. 6 is a cross-sectional view of the electronic circuit unit of the other embodiment, taken along line 6-6 of FIG. 5.

In FIG. 5, one end face of the peripheral walls 21a, 21b, 21c of the housing 20 is identical to the board mount portion 24. That is, the board 10 is placed on the board mount portion 24 that is the one end face (top portion) of the peripheral walls 21a, 21b, 21c opposite to the bottom wall 22. In addition, since the cover 30 is made larger than the housing 20 to some extent, the peripheral portion 32 of the cover 30 has its size approximately the same as that of the outer wall of the board mount portion 24 (peripheral walls 21a, 21b, 21c) of the housing 20. As shown in FIG. 6, the board 10 is secured to the housing 20, with the snap fitting hooks 28 fitting into the snap fitting receiving portions 34, and with the board 10 sandwiched between the housing 20 and the cover 30. In addition, forming the snap fitting hooks 28 on the outer portions of the housing 20 and snap fitting receiving portions 34 on the cover 30 can further eliminate space used for screw grooves, and thus man-hours needed to produce the electronic circuit unit can further be reduced.

Although the snap fitting hooks 28 are formed on the outer portions of the housing 20 and the snap fitting receiving portions 34 are formed on the cover 30 in FIG. 5, the snap fitting receiving portions 34 may be formed on outer portions of the housing 20 and the snap fitting hooks 28 may be formed on the cover 30.

In the present embodiment, the stays 26a, 26b, 26c may have any form. For example, the stays may be cylindrical stays 26d, 26e, 26f, as shown in FIG. 5. That is, the stays may have any form, depending on an intended use.

In the present embodiment, the recess portions 13 are formed at the four corners of the board 10. But the recess portions 13 may be omitted. For example, as shown in FIG. 6, the recess portions 13 may be omitted in the case where the snap fittings secure the board 10 to the housing 20. In this case, the board 10 is sandwiched, even at the four corners of the board 10, between the board mount portion 24 of the housing 20 and the peripheral portion 32 of the cover 30. The recess portions 13 may be omitted even in the case where the board 10 is secured to the housing 20 with screws.

The present embodiment describes the configuration in which the projection portions 44 are formed on the connector 40 and the groove portions 25 are formed in the housing 20, but is not limited to this. For example, the groove portions may be formed in the connector 40 and the projection portions may be formed on the housing 20. The projection portions 44 and the groove portions 25 may be omitted.

The present embodiment allows the board 10 to move to some extent, but is not limited to this. For example, the clearance between the board 10 and the peripheral walls 21a, 21b, 21c may be substantially removed to regulate the movement of the board 10.

What is claimed is:

1. An electronic circuit unit comprising:
    a board configured to mount an electronic component, the board having upper and lower surfaces;
    a housing including a bottom wall, side walls provided corresponding to a contour of the board, and a support portion inside the side walls and onto which an outer edge of the lower surface of the board is placed such that a clearance is provided between a first end face of the board and a facing side wall of the housing;
    an electrical connector for the electronic component, the electrical connector being secured to the board at a second end face of the board, which second end face is opposite the first end face;
    a cover to cover the board, the cover being provided corresponding to the contour of the side walls of the housing and placed on the housing, wherein the cover has an outer edge portion in contact with the upper surface of the board such that the outer edge of the board is sandwiched between the support portion of the housing and the outer edge portion of the cover; and
    at least one connector connecting the cover to the housing and capable of pressing the outer edge portion of the cover and the support portion of the housing onto the respective upper and lower surfaces of the board,
    wherein the board is able to move relative to the connected housing and cover by the width of the clearance when a force applied to the board by the electrical connector exceeds a frictional force of the cover and housing pressed onto the upper and lower surfaces of the board by the connector.

2. The electronic circuit unit according to claim 1, wherein the board is formed in a rectangular shape and the support portion is formed in a position corresponding to three sides of the board.

3. The electronic circuit unit according to claim 1, wherein the support portion is a step portion formed inside the side wall.

4. The electronic circuit unit according to claim 3, wherein
    an end face of the outer edge of the board is disposed inside an inner wall of the side walls;
    the inner wall extends from the step portion toward a side opposite to the bottom wall; and a clearance is formed between the end face and the inner wall.

5. The electronic circuit unit according to claim 1, wherein the support portion is an end face opposite the bottom wall.

6. The electronic circuit unit according to claim 1, wherein
- an opening to expose the electrical connector to the outside is formed in the side walls;
- the electrical connector has a snap fitting hook extending in a direction perpendicular to the surfaces of the board; and
- the board is provided with a snap fitting receiving portion to which the snap fitting hook is inserted.

7. The electronic circuit unit according to claim 6, wherein
- the housing has a slit-like groove portion;
- the electrical connector has a projection portion; and
- the projection portion is inserted into the groove portion to regulate the connector from moving relative to the housing.

8. The electronic circuit unit according to claim 6, wherein
- the housing has a projection portion;
- the electrical connector has a slit-like groove portion; and
- the projection portion is inserted into the groove portion to regulate the electrical connector from moving relative to the housing.

* * * * *